United States Patent
Ming et al.

(10) Patent No.: US 8,679,910 B2
(45) Date of Patent: Mar. 25, 2014

(54) METHODS OF FABRICATING DEVICES INCLUDING SOURCE/DRAIN REGION WITH ABRUPT JUNCTION PROFILE

(75) Inventors: Li Ming, Suwon-si (KR); Sangpil Sim, Seongnam-si (KR); Kang-ill Seo, Seongnam-si (KR); Changwoo Oh, Suwon-si (KR); Dongil Bae, Incheon (KR)

(73) Assignee: Samsung Electronics Co., Ltd. (KR)

( * ) Notice: Subject to any disclaimer, the term of this patent is extended or adjusted under 35 U.S.C. 154(b) by 269 days.

(21) Appl. No.: 13/218,547

(22) Filed: Aug. 26, 2011

(65) Prior Publication Data

US 2012/0088342 A1   Apr. 12, 2012

(30) Foreign Application Priority Data

Oct. 6, 2010  (KR) .................. 10-2010-0097386

(51) Int. Cl.
  *H01L 21/00*  (2006.01)
(52) U.S. Cl.
  USPC ........................ 438/224; 438/285; 438/300
(58) Field of Classification Search
  USPC ................... 438/285, 300, 224, 227
  See application file for complete search history.

(56) References Cited

U.S. PATENT DOCUMENTS

| | | | | |
|---|---|---|---|---|
| 5,093,275 | A | * | 3/1992 | Tasch et al. .............. 438/300 |
| 6,063,677 | A | * | 5/2000 | Rodder et al. ............. 438/300 |
| 7,381,622 | B2 | * | 6/2008 | Hellmich et al. ........... 438/300 |
| 7,626,215 | B2 | * | 12/2009 | Shimamune et al. ....... 257/190 |
| 7,667,227 | B2 | | 2/2010 | Shimamune et al. |
| 2009/0146181 | A1 | | 6/2009 | Lai et al. |

FOREIGN PATENT DOCUMENTS

| | | |
|---|---|---|
| JP | 4369359 B2 | 11/2009 |
| KR | 10-2001-0061036 A | 7/2001 |
| KR | 10-2006-0076150 A | 7/2006 |
| KR | 10-2009-0060165 A | 6/2009 |

OTHER PUBLICATIONS

K. Cheng et al., "Fully Deplete Extremely Thin SOI Technology Fabricated by a Novel Integration Scheme Featuring Implant-Free, Zero-Silicon-Loss, and Faceted Raised Source/Drain," Symposium on VLSI Technology Digest of Technical Papers, pp. 212-213 (2009).

* cited by examiner

*Primary Examiner* — Richard Booth
(74) *Attorney, Agent, or Firm* — Myers Bigel Sibley & Sajovec

(57) ABSTRACT

Provided are methods of fabricating a semiconductor device including a metal oxide semiconductor (MOS) transistor. The methods include forming a gate pattern on a semiconductor substrate. The semiconductor substrate is etched using the gate pattern as an etching mask to form a pair of active trenches spaced apart from each other in the semiconductor substrate. Epitaxial layers are formed in the active trenches, respectively. The respective epitaxial layers are formed by sequentially stacking first and second layers. The first and second layers are formed of a semiconductor layer having a lattice constant greater than the semiconductor substrate, and a composition ratio of the second layer is different from that of the first layer. Semiconductor devices having the first and second layers are also provided.

19 Claims, 4 Drawing Sheets

METHODS OF FABRICATING DEVICES INCLUDING SOURCE/DRAIN REGION WITH ABRUPT JUNCTION PROFILE

CROSS-REFERENCE TO RELATED APPLICATIONS

This U.S. non-provisional patent application claims priority under 35 U.S.C. §119 of Korean Patent Applications No. 10-2010-0097386, filed on Oct. 6, 2010, the entire contents of which are hereby incorporated by reference.

BACKGROUND

As integration density of semiconductor devices including metal oxide semiconductor (MOS) transistors increases, the sizes of the MOS transistors, e.g., channel lengths are gradually being decreased. The respective MOS transistors include a gate dielectric and gate electrode which are sequentially stacked on a channel region between source and drain regions as well as the source and drain regions formed in a semiconductor substrate. The source and drain regions are formed to have shallow junction depths and lightly doped drain (LDD) structures in order to suppress a short-channel effect. In this case, there may be a limitation in decreasing the electrical resistances of the source/drain regions.

Recently, highly integrated semiconductor devices are being designed to use power supply voltage lower than 2 or 3 volts. Therefore, the MOS transistors may suffer from high electrical resistances of the source/drain regions rather than a hot carrier effect and/or low drain breakdown voltage. That is, when the MOS transistors include the source/drain regions having typical LDD structures and shallow junction depths, current drivability of the MOS transistors may be significantly reduced due to the high resistances of the source/drain regions.

In general, after implanting impurity ions into the semiconductor substrate, the source/drain regions may be formed by activating and diffusing the impurity ions at a high temperature of about 800° C. or more. In this case, if the impurity ions are activated and diffused by sufficiently heat treating the substrate having the impurity ions at high temperatures, lateral diffusion lengths of the impurity ions may also be increased as well as vertical diffusion lengths. Therefore, it may be difficult to suppress the short-channel effect because channel lengths between the source and drain regions decrease. On the contrary, if the heat treatment time and temperature are not sufficient to activate the impurity ions, the decreasing of the channel lengths can be prevented. However, crystal defects, such as dislocations generated in the semiconductor substrate during the ion implantation process, may not be cured due to the insufficient heat treatment. These crystal defects may cause an increase in junction leakage current of the source/drain regions.

As described above, it may be difficult for the ion implantation process to form source/drain regions appropriate for highly integrated semiconductor devices. In addition, even if the source/drain regions are formed using the ion implantation process, there may be a limitation in forming the source/drain regions to have abrupt junction profiles. That is, even if sufficiently activated deep source/drain regions are formed using the ion implantation and heat treatment processes, there may be a limitation in decreasing the electrical resistances of the source/drain regions.

SUMMARY

The present disclosure provides semiconductor devices having source/drain regions appropriate for highly integrated semiconductor devices.

The present disclosure also provides methods of fabricating semiconductor devices having source/drain regions appropriate for highly integrated semiconductor devices.

Embodiments of the inventive concept provide semiconductor devices having metal oxide semiconductor (MOS) transistors including: a pair of epitaxial layers formed in a semiconductor substrate and spaced apart from each other; a gate pattern formed on the semiconductor substrate between the pair of epitaxial layers; and a pair of impurity regions formed at interfaces between the epitaxial layers and the semiconductor substrate. The respective epitaxial layers may include a first layer covering surfaces of the impurities and a second layer covering the first layer. The first and second layers may be semiconductor layers having lattice constants greater than the semiconductor substrate, and the second layer may have a composition ratio different from the first layer.

In some embodiments, the first layer may be a first silicon germanium layer having a first germanium content, and the second layer may be a second silicon germanium layer having a second germanium content higher than the first germanium content.

In other embodiments of the inventive concept, a method of fabricating a semiconductor device having MOS transistors may include: forming a gate pattern on a semiconductor substrate; etching the semiconductor substrate using the gate pattern as an etching mask to form a pair of active trenches spaced apart from each other in the semiconductor substrate; and forming epitaxial layers in the active trenches, respectively. The respective epitaxial layers may be formed by sequentially stacking first and second layers, the first and second layers may be formed of a semiconductor layer having a lattice constant greater than the semiconductor substrate, and a composition ratio of the second layer may be different from that of the first layer.

In still other embodiments, the gate pattern may be formed to include a gate dielectric, a gate electrode, and a capping insulation layer which are sequentially stacked.

In even other embodiments, the method may further include forming a spacer on sidewalls of the gate pattern before the forming of the active trenches. In this case, the active trenches may be formed using the gate pattern and the spacer as etching masks.

In yet other embodiments, the first layers may be formed to cover inner walls of the active trenches, and the second layers may be formed to completely fill the active trenches on the first layers.

In further embodiments, the first layer may be formed of a first silicon germanium layer having a first germanium content, and the second layer may be formed of a second silicon germanium layer having a second germanium content higher than the first germanium content.

In still further embodiments, the first layer may be formed to have a first P-type impurity concentration, and the second layer may be formed to have a second P-type impurity concentration higher than the first P-type impurity concentration. In this case, the method may further include forming source/drain regions by diffusing the P-type impurities in the epitaxial layers into the semiconductor substrate after the forming of the epitaxial layers. The epitaxial layers may be formed using an in-situ doping.

In even further embodiments, the method may further include forming a third layer on the second layer. In this case, the respective epitaxial layers may include the first, second, and third layers, which are sequentially stacked. The third layer may be formed of the same material layer as the semiconductor substrate. Also, the method may further include forming a metal silicide layer on the third layer.

In yet further embodiments of the inventive concept, a method of fabricating a complementary metal oxide semiconductor (CMOS) integrated circuit having N-MOS and P-MOS transistors may include: forming a device isolation layer in a predetermined region of a semiconductor substrate including first and second regions to define first and second active regions in the first and second regions, respectively; forming first and second gate patterns on the first and second active regions, respectively; etching the first and second active regions using the gate patterns and the device isolation layer as etching masks to form a pair of first active trenches in the first active region and a pair of second active trenches in the second active region; forming first epitaxial layers in the first and second active trenches; exposing inner walls of the first active trenches by selectively removing the first epitaxial layers in the first active trenches; and forming second epitaxial layers in the first active trenches after the removing of the first epitaxial layers in the first active trenches.

In much further embodiments, the first and second regions may be N-channel and P-channel MOS transistor regions, respectively.

In still much further embodiments, the forming of the first epitaxial layers may include forming a first layer covering inner walls of the active trenches, and forming a second layer covering the first layer and filling the active trench on the first layer. The first layers and the second layers may be formed of a semiconductor layer having a lattice constant greater than the semiconductor substrate. A composition ratio of the first layer may be different from that of the second layer. The first layers and the second layers may be formed of a first silicon germanium layer having a first germanium content and a second silicon germanium layer having a second germanium content higher than the first germanium content. The first layers may be formed to have a first P-type impurity concentration, and the second layers may be formed to have a second P-type impurity concentration higher than the first P-type impurity concentration.

In even much further embodiments, the second epitaxial layers may be formed of a silicon layer doped with N-type impurities or a silicon carbide layer doped with N-type impurities, when the semiconductor substrate is a silicon substrate.

In yet much further embodiments, the method may further include forming source/drain regions by diffusing impurities in the first and second epitaxial layers into the semiconductor substrate, after the forming of the second epitaxial layers. The first and second epitaxial layers may be doped in-situ.

Some embodiments disclosed herein include methods of fabricating a semiconductor device. Such methods include forming a first gate pattern on a first active region of a substrate and a second gate pattern on a second active region of the substrate. The first and second active region are defined by a device isolation layer. The first active region may be etched to form a pair of first active trenches and the second active region may be etched to form a pair of second active trenches. Multiple first epitaxial layers are formed in the first and second active trenches. Inner walls of the first active trenches may be exposed by selectively removing the first epitaxial layers in the first active trenches. Second epitaxial layers may be formed in the first active trenches after the removing of the first epitaxial layers in the first active trenches.

In some embodiments, at least one of the first epitaxial layers includes a first conductivity type impurity and at least one of the second epitaxial layers includes a second conductivity type impurity that is different that the first conductivity type impurity.

Some embodiments provide that forming the first epitaxial layers includes forming a first silicon germanium layer that covers inner walls of the first and second active trenches and that includes a first germanium content and forming a second silicon germanium layer that covers the first layer and that fills the first and second active trenches. In some embodiments, the second silicon germanium layer included a second germanium content that is greater than the first germanium content.

Some embodiments provide that forming the first epitaxial layers further includes forming a third silicon layer that covers the second silicon germanium layer and that includes substantially no germanium content.

Some embodiments include applying a heat treatment process to form first and second impurity regions by diffusing impurities from the first epitaxial layers and the second epitaxial layers into the semiconductor substrate. In some embodiments, the first and second impurity regions include abrupt junction profiles and are substantially free of crystal defects. Some embodiments provide that the first impurity region is an N-channel metal oxide semiconductor transistor region that the second impurity region is a P-channel metal oxide semiconductor transistor region.

It is noted that aspects of the disclosure described with respect to one embodiment, may be incorporated in a different embodiment although not specifically described relative thereto. That is, all embodiments and/or features of any embodiment can be combined in any way and/or combination. These and other objects and/or aspects of the present disclosure are explained in detail in the specification set forth below.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
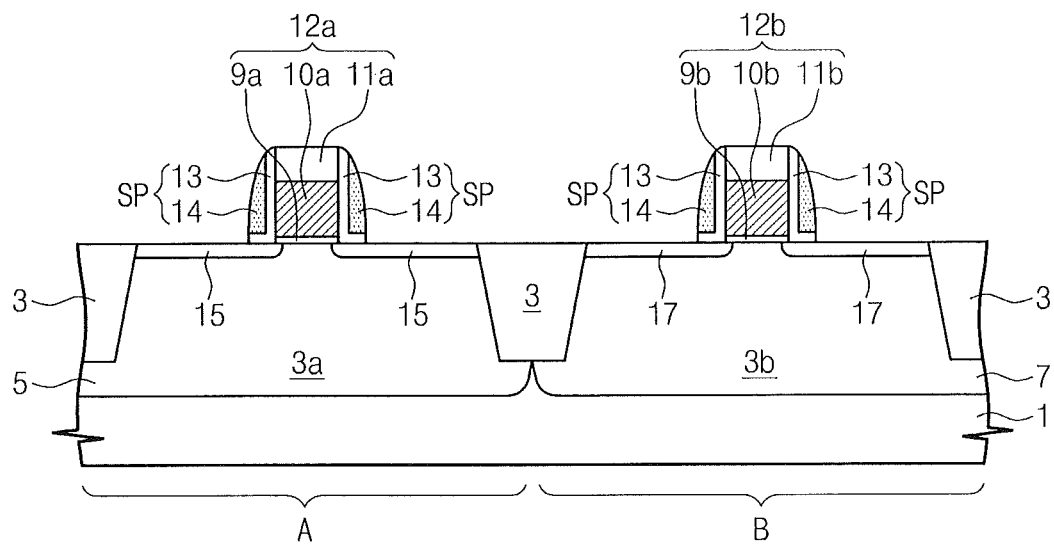
FIGS. 1 through 6 are cross-sectional views illustrating fabricating methods of a semiconductor device according to some embodiments of the inventive concept.

The present disclosure now will be described more fully hereinafter with reference to the accompanying drawings, in which embodiments of the disclosure are shown. However, this disclosure should not be construed as limited to the embodiments set forth herein. Rather, these embodiments are provided so that this disclosure will be thorough and complete, and will fully convey the scope of the disclosure to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present disclosure. In addition, as used herein, the singular forms "a", "an" and "the" are intended to include the plural forms as well, unless the context clearly indicates otherwise.

It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. The present disclosure will now be described more fully hereinafter with reference to the accompanying drawings, in which some embodiments of the disclosure are shown. This disclosure, however, may be embodied in many different forms and should not be construed as limited to the embodiments set forth herein. Rather, these embodiments are provided so that this disclosure will be thorough and complete, and will fully convey the scope of the disclosure to those skilled in the art.

It should be construed that forgoing general illustrations and following detailed descriptions are exemplified and an additional explanation of claimed disclosures is provided.

Reference numerals are indicated in detail in some embodiments of the present disclosure, and their examples are represented in reference drawings. Throughout the drawings, like reference numerals are used for referring to the same or similar elements in the description and drawings.

Hereinafter, embodiments of the inventive concept will be described in more detail with reference to the accompanying drawings. Advantages and features of the inventive concept, and implementation methods thereof will be clarified through following embodiments described with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art, and the inventive concept is only defined by scopes of claims. Like reference numerals refer to like elements throughout.

While specific terms were used in the specification, they were not used to limit the inventive concept, but merely used to explain the exemplary embodiments. In the inventive concept, the terms of a singular form may include plural forms unless otherwise specified. The meaning of "includes," "including," "comprises," and/or "comprising," specifies a property, a region, a fixed number, a step, a process, an element and/or a component but does not exclude other properties, regions, fixed numbers, steps, processes, elements and/or components. Since example embodiments are provided below, the order of the reference numerals given in the description is not limited thereto.

Additionally, the embodiments in the detailed description will be described with sectional views and/or plan views as ideal exemplary views of the inventive concept. In the drawings, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate a specific shape of a device region. Thus, this should not be construed as limited to the scope of the inventive concept.

First, methods of fabricating a semiconductor device according to some embodiments of the inventive concept will be described.

FIGS. 1 through 6 are cross-sectional views illustrating methods of fabricating a semiconductor device according to some embodiments of the inventive concept.

Referring to FIG. 1, a device isolation layer 3 is formed in a predetermined region of a semiconductor substrate 1 having first and second regions A and B to define first and second active regions 3a and 3b in the first and second regions A and B, respectively. The semiconductor substrate 1 may be a silicon substrate. Also, the first and second regions A and B may be N-channel and P-channel metal oxide semiconductor (MOS) transistor regions, respectively. A first well 5 and second well 7 may be formed in the first and second regions A and B, respectively. When the first and second regions A and B are N-channel and P-channel MOS transistor regions, respectively, the first and second wells 5 and 7 are a P-well and N-well, respectively.

A first gate pattern 12a and second gate pattern 12b are formed on the first and second active regions 3a and 3b, respectively. The first and second gate patterns 12a and 12b may be formed to cross the first and second active regions 3a and 3b, respectively. The first gate pattern 12a may be formed to include a first gate dielectric 9a, a first gate electrode 10a, and a first capping insulation layer 11a, which are sequentially stacked, and the second gate pattern 12b may be formed to include a second gate dielectric 9b, a second gate electrode 10b, and a second capping insulation layer 11b, which are sequentially stacked. The first gate dielectric 9a may be the same material layer as the second gate dielectric 9b, and the first gate electrode 10a may be the same material layer as the second gate electrode 10b. Likewise, the first capping insulation layer 11a may be the same material layer as the second capping insulation layer 11b.

In some embodiments, a pair of first halo regions 15 spaced apart from each other may be formed by implanting first conductive-type impurity ions in the first active region 3a using the first gate pattern 12a and the device isolation layer 3 as ion implantation masks. Likewise, a pair of second halo regions 17 spaced apart from each other may be formed by implanting second conductive-type impurity ions in the second active region 3b using the second gate pattern 12b and the device isolation layer 3 as ion implantation masks. When the first and second regions A and B are N-channel and P-channel MOS transistor regions, the first and second conductive-types may be a P-type and N-type, respectively. In other embodiments, a process, which forms the first and second halo regions 15 and 17, may not be provided or may be performed in a subsequent process.

First and second spacer insulation layers may be sequentially formed on a front surface of the substrate having the first and second gate patterns 12a and 12b or the first and second halo regions 15 and 17. Inner spacers SP may be formed on sidewalls of the gate patterns 12a and 12b by anisotropically etching the first and second spacer insulation layers. In this case, the respective inner spacers SP may be formed to include a first spacer 13 covering the sidewalls of the respective gate patterns 12a and 12b and a second spacer 14 covering outer sidewalls of the first spacer 13. In some embodiments, the second spacer 14 may be formed of a material layer having etch selectivity with respect to the first spacer 13. For example, when the first spacer 13 is formed of a silicon oxide layer, the second spacer 14 may be formed of a silicon nitride layer. After forming the inner spacers SP, the second active region 3b at both sides of the second gate pattern 12b may be exposed as well as the first active region 3a at both sides of the first gate pattern 12a.

Figure 2:
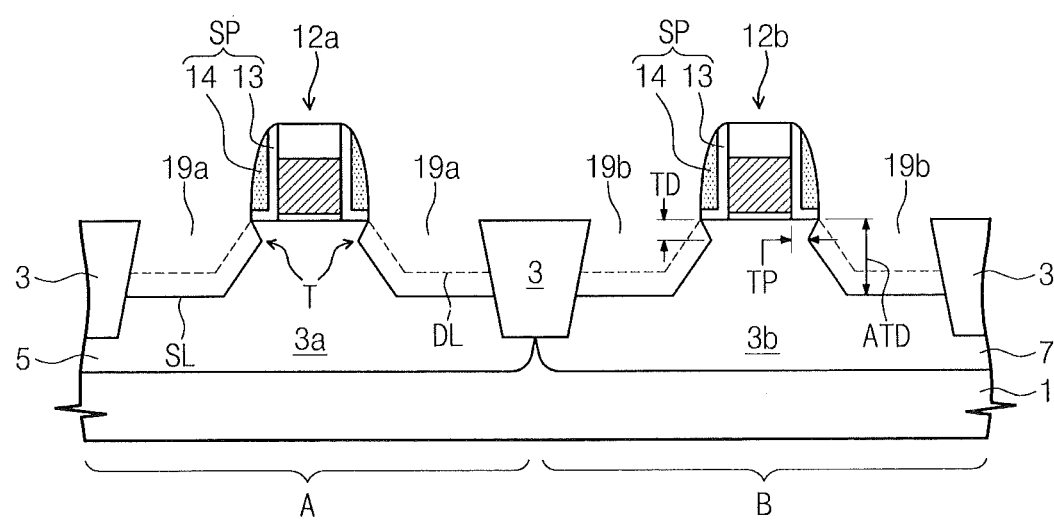

Referring to FIG. 2, the exposed first and second active regions 3a and 3b are etched to form a pair of first active trenches 19a in the first active region 3a and a pair of second active trenches 19b in the second active region 3b. The first and second active trenches 19a and 19b may be formed using various methods. In some embodiments, the first and second active trenches 19a and 19b may be formed using only a dry etching process. In such cases, the first and second active trenches 19a and 19b may be formed to have inner walls DL marked with the dotted lines of FIG. 2.

Alternatively, the first and second active trenches 19a and 19b may be formed by sequentially performing dry etching and wet etching processes. The dry etching process may be performed using a recipe having anisotropic etching characteristics, and the wet etching process may be performed using a recipe exhibiting isotropic etching characteristics. In some embodiments, the wet etching process may be performed using a chemical solution such as ammonium hydroxide ($NH_4OH$). In this case, the respective first and second active trenches 19a and 19b may be formed to have a "sigma shaped" inner wall marked with a reference sign SL of FIG. 2. That is, the inner wall SL may be formed to have a tip portion T protruded toward a channel region below the gate pattern 12a or 12b as illustrated in FIG. 2.

A profile of the inner wall SL may be determined by tip depth TD, tip proximity TP, and active trench depth ATD. The tip depth TD represents a vertical distance from an initial surface of the active regions 3a and 3b to the tip portion T, and the tip proximity TP represents a lateral distance from the sidewall of the gate pattern 12a or 12b to the tip portion T adjacent thereto. Also, the active trench depth ATD represents a vertical distance from the initial surface of the active regions 3a and 3b to a bottom surface of the tip portion T. If the tip proximity TP has a positive value, the tip portions T may be positioned below the inner spacers SP. On the contrary, if the tip proximity TP has a negative value, the tip portions T may be positioned in channel regions below the gate patterns 12a and 12b.

In some embodiments, the tip depth TD may have a value in the range of about 0 nm to about 15 nm, and the tip proximity TP may have a value in the range of about −3 nm to about +3 nm. Also, the active trench depth ATD may have a value of about 40 nm.

All drawings described hereinafter will be illustrated to include the inner wall SL having the tip portion T in order to avoid complexity of the description. However, the inventive concept is not limited to a semiconductor device having only the inner wall SL profile, and may also be applied to semiconductor devices having various other inner wall profiles.

Figure 3:
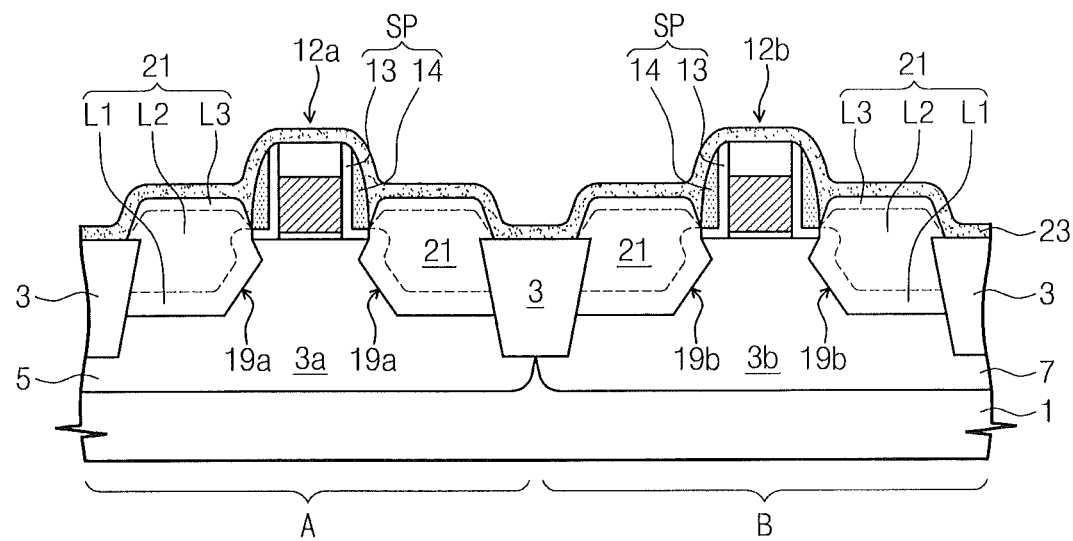

Referring to FIG. 3, a plurality of first epitaxial layers 21 is formed to fill the active trenches 19a and 19b, respectively. The respective first epitaxial layers 21 may be formed to include a first layer L1 and second layer L2 which are sequentially stacked. The first layers L1 may be formed to cover the inner walls SL of the active trenches 19a and 19b, and the second layers L2 may be formed to sufficiently fill the active trenches 19a and 19b as well as cover the first layers L1.

In some embodiments, when the semiconductor substrate 1 is a silicon substrate, the first and second layers L1 and L2 may be formed of a semiconductor layer having a lattice constant greater than the silicon substrate. The semiconductor layer may be a compound semiconductor layer. For example, the first and second layers L1 and L2 may be formed of a first silicon germanium (SiGe) layer and second silicon germanium layer, respectively. In this case, the first and second layers L1 and L2, i.e., the first and second silicon germanium layers, may be grown using epitaxial technology employing a silicon source gas, a germanium source gas, and an impurity gas as process gases. In the present embodiments, the first epitaxial layers 21 may be grown at a temperature of about 400° C. to about 600° C. The process gases may further include inert gases such as nitrogen, helium, and argon as well as an etching gas such as hydrogen chloride (HCl).

As described above, when the first and second layers L1 and L2 are formed of the semiconductor layer having a lattice constant greater than the semiconductor substrate 1, compressive stress may be applied to the channel region below the second gate pattern 12b in the P-channel MOS transistor region B. That is, the first and second layers L1 and L2 increase hole mobility in the channel region located in the second region B such that electrical characteristics of the P-channel MOS transistor may be improved.

When germanium contents of the layers L1 and L2 are increased, the stress applied to the channel region is excessively increased such that crystal defects are generated at an interface between the first epitaxial layer 21 and the channel region adjacent thereto. These crystal defects deteriorate reliability and electrical characteristics (e.g., junction leakage current characteristics) of a semiconductor device. A heat treatment process, which is performed at a temperature higher than about 900° C., may be required in order to reduce or remove the crystal defects. However, when the heat treatment process is applied at the temperature higher than about 900° C., diffusion lengths of impurities are increased such that it is difficult to suppress a short-channel effect. Therefore, in order to suppress generation of the crystal defects without using the heat treatment process at high temperatures, it may be beneficial that a germanium content of the first layer L1 is lower than that of the second layer L2. That is, the second layers L2 may be formed to have a composition ratio different from the first layers L1.

In some embodiments, the first layer L1 may be formed to have a first germanium content, and the second layer L2 may be formed to have a second germanium content higher than the first germanium content. For example, the first layer L1 may be formed to have a germanium content of about 20 atomic % to about 30 atomic %, and the second layer L2 may be formed to have a germanium content of about 35 atomic % to about 50 atomic %. That is, the first layer L1 may function as a buffer layer alleviating the stress of the second layer L2. The first layers L1 may be formed to a thickness of about 10 nm to about 20 nm, and the second layers L2 may be formed to a thickness of about 30 nm to about 50 nm.

The first and second layers L1 and L2, i.e., the silicon germanium layers may be doped with P-type impurities such as boron for the P-channel MOS transistor. In this case, diffusivities of the P-type impurities in the silicon germanium layers may be decreased when the germanium contents of the silicon germanium layers are increased. Therefore, in order to properly diffuse the P-type impurities in the first and second layers L1 and L2 in a subsequent process, it may be advantageous that the P-type impurity concentration of the first layer L1 having the first germanium content is lower than that of the second layer L2 having the second germanium content. For example, the second layer L2 may be formed to have a P-type impurity concentration higher than the first layer L1. Specifically, the first layer L1 may be formed to have a P-type impurity concentration of about $1 \times 10^{17}/cm^3$ to about $1 \times 10^{19}/cm^3$, and the second layer L2 may be formed to have a P-type impurity concentration of about $5 \times 10^{19}/cm^3$ to about $3 \times 10^{20}/cm^3$. The first and second layers L1 and L2 may be formed to include the P-type impurities using an in-situ doping technique.

In some embodiments, the respective first epitaxial layers may be formed to further include a third layer L3 covering the second layer L2. The third layer L3 may be formed of a silicon (Si) layer with no germanium content. This is for stably forming a metal silicide layer such as a nickel silicide layer on the third layer L3. That is, if all of the first through third layers L1, L2 and L3 are formed of a silicon germanium layer, and a metal silicide layer is formed on the third layer L3, the metal silicide layer may generate a junction spiking phenomenon by penetrating the first through third layers L1, L2 and L3. The third layers L3 may be formed to a thickness of about 10 nm to about 15 nm.

In some embodiments, the third layer L3 may be formed to have an impurity concentration higher than the impurity concentration of the first or second layer L1 or L2. For example, the third layer L3 may be formed of a silicon layer or a silicon germanium layer having a P-type impurity concentration of about $1 \times 10^{20}/cm^3$ to about $1 \times 10^{21}/cm^3$. This is for reducing contact resistance between the first epitaxial layers 21 and source/drain electrodes formed later (not illustrated).

Referring again to FIG. 3, a mask layer 23 may be formed on the substrate having the first epitaxial layers 21. The mask layer 23 may be formed of the same material as the second spacer 14. For example, if the second spacer is formed of a silicon nitride layer, the mask layer 23 may also be formed of silicon nitride layer.

Figure 4:
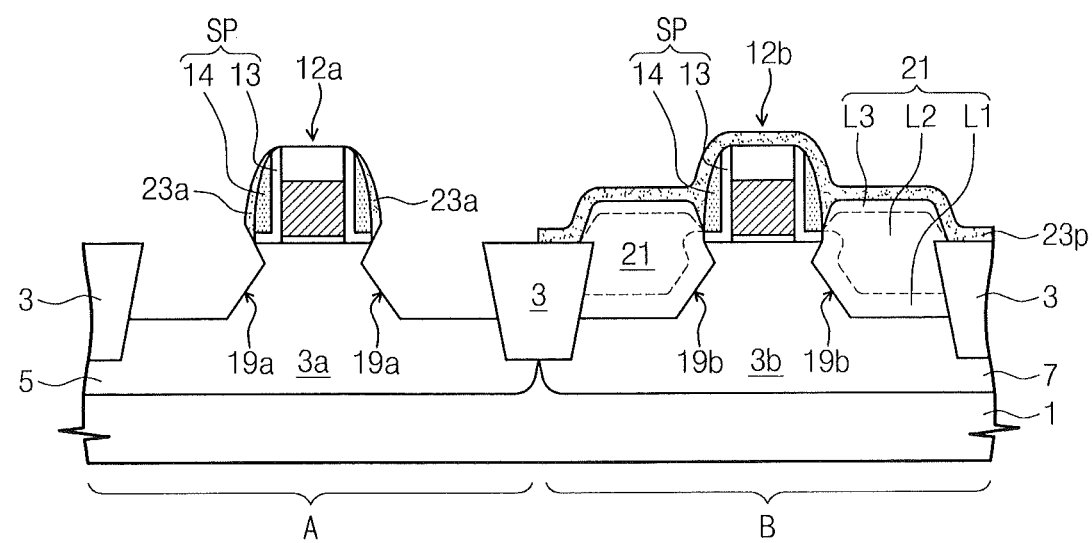

Referring to FIG. 4, a mask pattern 23p, which exposes the first epitaxial layers 21 in the first region A, is formed by patterning the mask layer 23. During the forming of the mask pattern 23p, a first outer spacer 23a may be formed on the outer sidewalls of the inner spacer SP in the first region A. The inner walls of the first active trenches 19a in the first region A are exposed by selectively removing the exposed first epitaxial layers 21. The first epitaxial layers 21 in the first region A may be selectively removed using a wet etchant, e.g., ammonium hydroxide ($NH_4OH$).

Figure 5:
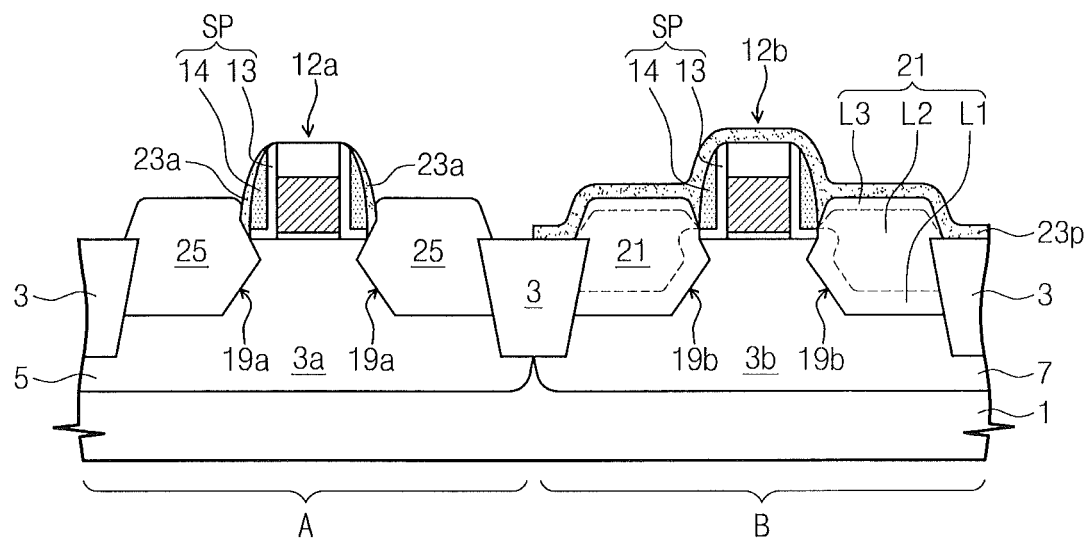

Referring to FIG. 5, second epitaxial layers 25 are selectively formed in the first active trenches 19a in the first region A. The second epitaxial layers 25 may be grown using epitaxial technology employing a silicon source gas and an impurity gas as process gases. In addition, the second epitaxial layers 25 may be grown at a temperature of about 400° C. to about 600° C. The process gases may further include inert gases such as nitrogen, helium, and argon as well as an etching gas such as hydrogen chloride (HCl).

The second epitaxial layers 25 may be formed of a silicon layer or a silicon carbide (SiC) layer. The silicon carbide layer increases electron mobility in the silicon substrate by applying tensile stress on the silicon substrate. Therefore, if the second epitaxial layers 25 are formed of a silicon carbide layer, performance of the N-channel MOS transistor formed in the first region A may be improved. Also, the second epitaxial layers 25 may be doped with N-type impurities using an in-situ technique.

Figure 6:
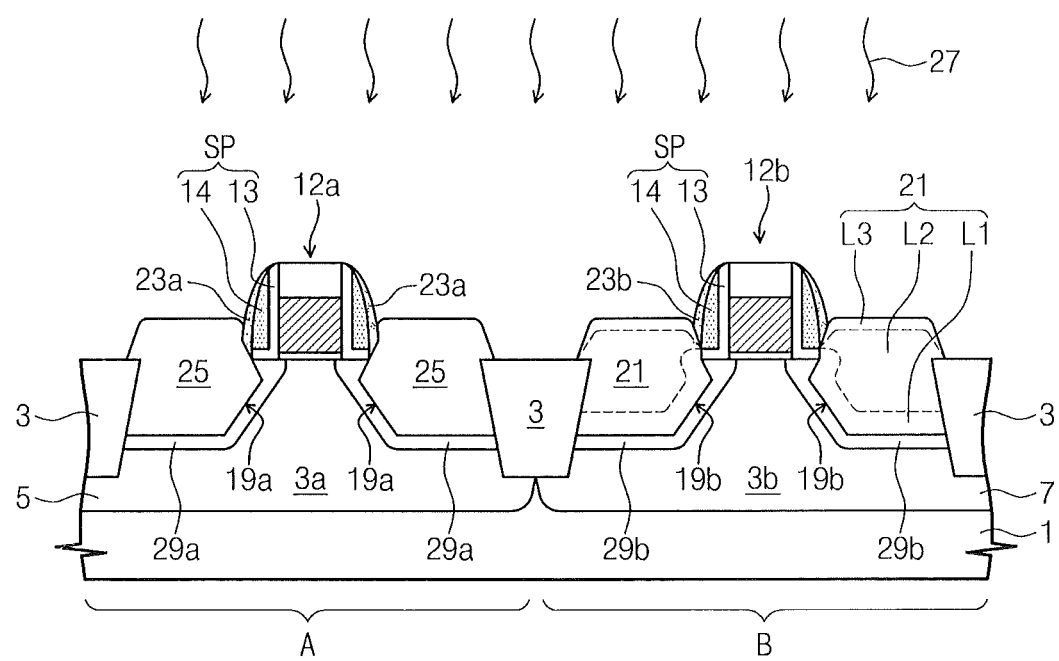

Referring to FIG. 6, the first epitaxial layers 21 may be exposed by etching the mask pattern 23p. When the mask pattern 23p is etched anisotropically, a second outer spacer 23b may be formed on the outer sidewalls of the inner spacer SP which is on the sidewalls of the second gate pattern 12b. Subsequently, metal silicide layers (not illustrated) may be formed on surfaces of the first epitaxial layers 21 and the second epitaxial layers 25. The forming process of the metal silicide layers may be omitted.

Impurities in the first and second epitaxial layers 21 and 25 are diffused by applying a heat treatment process 27 to the substrate including the metal silicide layers or the second outer spacer 23b. As a result, first impurity regions 29a and second impurity regions 29b may be formed in the first active region 3a and the second active region 3b, respectively.

The first impurity regions 29a may be formed to surround the second epitaxial layers 25, and second impurity regions 29b may be formed to surround the first epitaxial layers 21. When the second epitaxial layers 25 are doped with N-type impurities, the first impurity regions 29a may function as source/drain regions of the N-channel MOS transistor. Likewise, when the first epitaxial layers 21 are doped with P-type impurities, the second impurity regions 29b may function as source/drain regions of the P-channel MOS transistor.

As described above, the first impurity regions 29a and the second impurity regions 29b according to the present embodiments may be formed only by the heat treatment process 27 without using an ion implantation process. Therefore, if the temperature and time of the heat treatment process 27 are properly controlled, the first and second impurity regions 29a and 29b may be formed to have shallow and abrupt junction profiles without any or significant crystal defects.

In other embodiments, before performing the heat treatment process 27, impurity ions may be implanted in the surfaces of the second epitaxial layers and/or the first epitaxial layers 21. In this case, if energy of the impurity ion implantation process is adjusted, a projection range of the impurity ions may be controlled to be significantly less than depths of the active trenches 19a and 19b. Therefore, even if the ion implantation process is additionally performed before the heat treatment process 27, the junction leakage current characteristics and junction profiles of the source/drain regions 29a and 29b may not be deteriorated.

Figure 7:
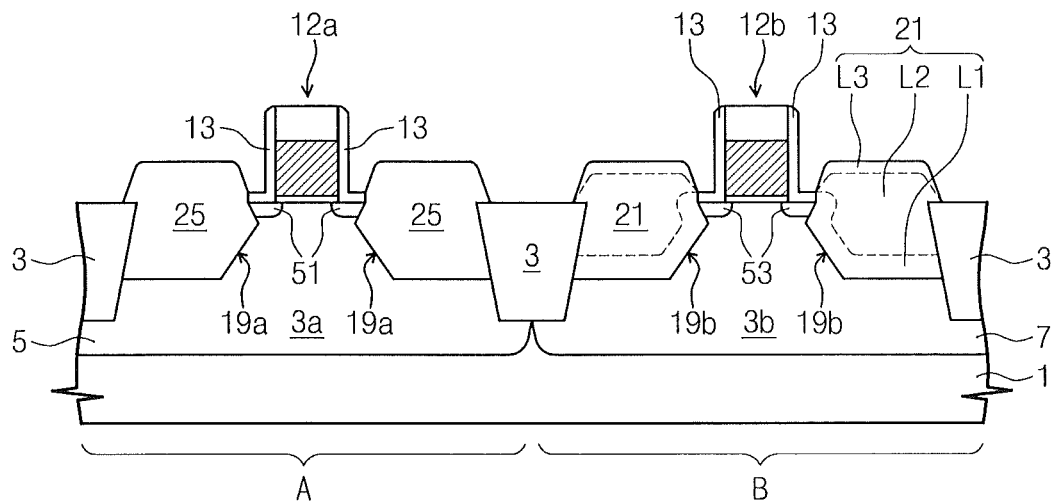
FIGS. 7 and 8 are cross-sectional views illustrating fabricating methods of a semiconductor device according to yet other embodiments of the inventive concept.
Figure 8:
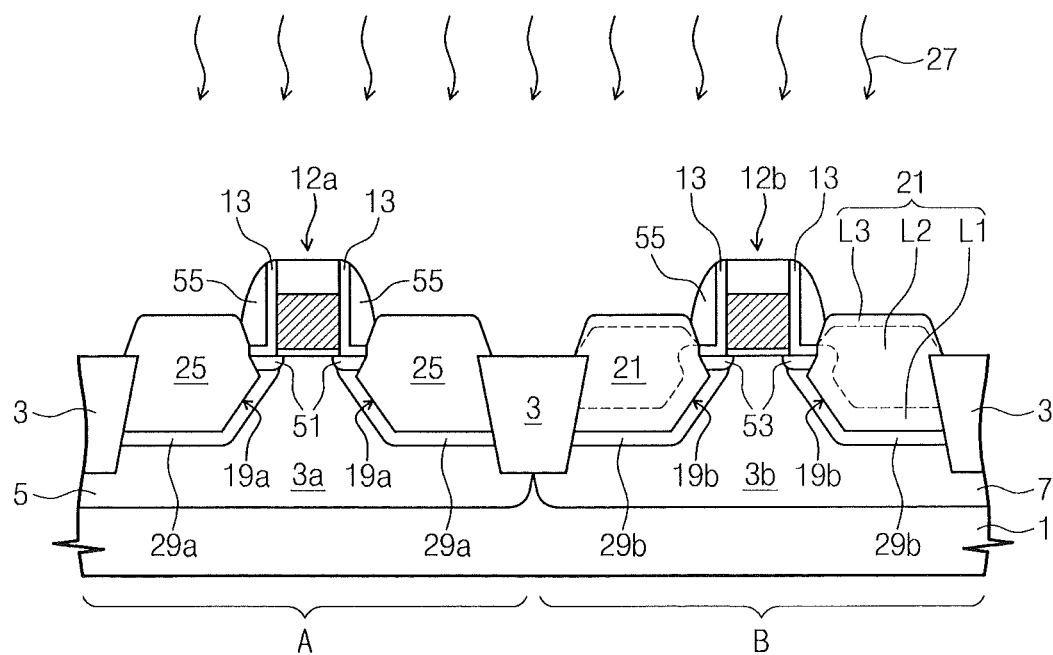

FIGS. 7 and 8 are cross-sectional views illustrating methods of fabricating a semiconductor device according to some embodiments of the inventive concept. The present embodiments may be applicable to cases where a process of forming the first and second halo regions 15 and 17 of FIG. 1 is omitted.

Referring to FIG. 7, the mask pattern 23p and the first and second epitaxial layers 21 and 25 are formed using methods as described above with reference to FIGS. 1 through 5. Subsequently, the first spacers 13 are exposed by selectively removing the mask pattern 23p, the first outer spacer 23a, and the second spacers 14. The mask pattern 23p, the first outer spacer 23a, and the second spacers 14 may be formed of the same material layer, e.g., a silicon nitride layer, as described with reference to FIGS. 1 through 4. Therefore, the mask pattern 23p, the first outer spacer 23a, and the second spacers 14 may be selectively removed using a single etching process employing phosphoric acid ($H_3PO_4$) as an etching solution.

After exposing the first spacers 13, N-type impurity ions may be implanted in the first active region 3a using the first gate pattern 12a as an ion implantation mask. As a result, first low concentration regions 51, which have lightly doped drain (LDD) structures below the first spacers 13 in the first region A, may be formed. Likewise, P-type impurity ions may be implanted in the second active region 3b using the second gate pattern 12b as an ion implantation mask. As a result, second low concentration regions 53, which have lightly doped drain structures below the first spacers 13 in the second region B, may be formed.

In some embodiments, first and second halo regions (not illustrated) may be formed instead of the first and second low concentration regions 51 and 53. In such cases, the first halo regions may be formed below the first spacers 13 in the first region A, and the second halo regions may be formed below the first spacers 13 in the second region B. When the first and second regions A and B are N-channel and P-channel MOS transistor regions, respectively, the first and second halo regions may be P-type and N-type impurity regions, respectively.

Referring to FIG. 8, a spacer insulation layer may be formed on the substrate including the low concentration regions 51 and 53 or the halo regions. The spacer insulation layer may be formed of a silicon oxide layer. Final spacers 55 may be formed on the outer sidewalls of the first spacers 13 by anisotropically etching the spacer insulation layer. Subsequently, the heat treatment process 27 is applied to the substrate having the final spacers 55. As a result, the first and second impurity regions 29a and 29b may be formed to be adjacent the first and second low concentration regions 51 and 53, respectively.

Now, a semiconductor device according to some embodiments of the inventive concept will be described with reference again to FIG. 6.

Referring to FIG. 6, a device isolation layer 3 is disposed in a predetermined region of a semiconductor substrate 1 having first region A and second region B. The device isolation layer 3 defines first and second active regions 3a and 3b in the first and second regions A and B, respectively. In some embodiments, the first and second regions A and B may be N-channel and P-channel MOS transistor regions, respectively. The semiconductor substrate 1 may be a silicon substrate.

A pair of first epitaxial layers 21 spaced apart from each other may be disposed in the second active region 3b. The first epitaxial layers 21 may have upper surfaces higher than the upper surface of the second active region 3b. Likewise, a pair of second epitaxial layers 25 spaced apart from each other may be disposed in the first active region 3a. The second epitaxial layers 25 may also have upper surfaces higher than the upper surface of the first active region 3a. That is, the first and second epitaxial layers 21 and 25 may include protrusion portions higher than the upper surfaces of the active regions 3a and 3b.

A first gate pattern 12a may be disposed on the first active region 3a between the pair of second epitaxial layers 25, and a second gate pattern 12b may be disposed on the second active region 3b between the pair of first epitaxial layers 21. Inner spacers SP may be disposed on sidewalls of the first and second gate patterns 12a and 12b. In this case, protrusion portions of the epitaxial layers 21 and 25 may be in contact with outer sidewalls of the inner spacers SP.

A pair of first impurity regions 29a is disposed in the first active region 3a along interfaces between the second epitaxial layers 25 and the first active region 3a, and a pair of second impurity regions 29b is disposed in the second active region 3b along interfaces between the first epitaxial layers 21 and the second active region 3b. That is, the first impurity regions 29a may be disposed to surround the second epitaxial layers 25, and the second impurity regions 29b may be disposed to surround the first epitaxial layers 21.

The first epitaxial layers 21 and the second impurity regions 29b may be regions doped with P-type impurities, and the second epitaxial layers 25 and the first impurity regions 29a may be regions doped with N-type impurities. That is, the first impurity regions 29a may correspond to source/drain regions of an N-channel MOS transistor, and the second impurity regions 29b may correspond to source/drain regions of a P-channel MOS transistor.

The respective first epitaxial layers 21 may include a first layer L1 covering the surface of the second impurity region 29b and a second layer L2 covering the first layer L1. The first and second layers L1 and L2 may be semiconductor layers having lattice constants greater than the semiconductor substrate 1, i.e., the second active region 3b, and the second layer L2 may have a composition ratio different from the first layer L1.

In some embodiments, the first layer L1 may be a first silicon germanium layer having a first germanium content, and the second layer L2 may be a second silicon germanium layer having a second germanium content that is higher than the first germanium content.

In addition, the respective first epitaxial layers 21 may further include a third layer L3 on the second layer L2. The third layer L3 may be a silicon layer with no germanium content. The second epitaxial layers 25 may be a silicon layer or a silicon carbide layer.

According to some embodiments of the inventive concept, source/drain regions are formed by diffusing impurities in doped epitaxial layers which are formed in a semiconductor substrate without using an ion implantation process. In this case, no crystal defects are generated in the semiconductor substrate. Therefore, a heat treatment process for diffusing the impurities can be performed at a low temperature. That is, a high-temperature heat treatment process may not be used for activating the impurities. As a result, the source/drain regions may exhibit excellent junction leakage current characteristics as well as abrupt junction profiles and shallow junction depths.

While this inventive concept has been particularly shown and described with reference to some embodiments thereof, it will be understood by those skilled in the art that various changes in form and details may be made therein without departing from the spirit and scope of the inventive concept as defined by the appended claims. The disclosed embodiments should be considered in descriptive sense only and not for purposes of limitation.

What is claimed is:

1. A method of fabricating a semiconductor device, the method comprising:
   forming a gate pattern on a semiconductor substrate;
   etching the semiconductor substrate using the gate pattern as an etching mask to form a pair of active trenches that are spaced apart from each other in the semiconductor substrate; and
   forming epitaxial layers in each of the pair of active trenches,
   wherein the epitaxial layers include sequentially stacked first and second layers that include semiconductor layers having a lattice constant greater than the semiconductor substrate,
   wherein a composition ratio of the second layers is different from that of the first layers, and wherein the first layers are formed to cover inner walls of the pair of active trenches, and the second layers are formed to substantially fill the active trenches on the first layers.

2. The method of claim 1, wherein the first layers are formed of a first silicon germanium layer having a first germanium content, and the second layers are formed of a second silicon germanium layer having a second germanium content higher than the first germanium content.

3. The method of claim 1, wherein the first layers are formed to have a first P-type impurity concentration, and the second layers are formed to have a second P-type impurity concentration higher than the first P-type impurity concentration.

4. The method of claim 3, further comprising forming source/drain regions by diffusing the P-type impurities in the epitaxial layers into the semiconductor substrate after the forming of the epitaxial layers,
wherein the epitaxial layers are formed using an in-situ doping.

5. The method of claim 1, further comprising forming third layers on the second layers,
wherein the respective epitaxial layers comprise the first, second, and third layers which are sequentially stacked, wherein the third layer is formed of a same material layer as the semiconductor substrate.

6. The method of claim 5, further comprising forming a metal silicide layer on the third layer.

7. A method of fabricating a semiconductor device, the method comprising:
forming a first gate pattern on a first active region of a substrate and a second gate pattern on a second active region of the substrate, the first and second active regions being defined by a device isolation layer;
etching the first active region to form a pair of first active trenches;
etching the second active region to form a pair of second active trenches;
forming a plurality of first epitaxial layers in the first and second active trenches;
exposing inner walls of the first active trenches by selectively removing the first epitaxial layers in the first active trenches; and
forming second epitaxial layers in the first active trenches after the removing of the first epitaxial layers in the first active trenches,
wherein at least one of the plurality of first epitaxial layers includes a first conductivity type impurity, and
wherein at least one of the plurality of second epitaxial layers includes a second conductivity type impurity that is different that the first conductivity type impurity.

8. The method according to claim 7,
wherein forming the plurality of first epitaxial layers comprises:
forming a first silicon germanium layer on inner walls of the first and second active trenches and that includes a first germanium content; and
forming a second silicon germanium layer on the first layer and that fills the first and second active trenches, the second silicon germanium layer including a second germanium content that is greater than the first germanium content.

9. A method of fabricating a semiconductor device, the method comprising:
forming a first gate pattern on a first active region of a substrate and a second gate pattern on a second active region of the substrate, the first and second active regions being defined by a device isolation layer;
etching the first active region to form a pair of first active trenches;
etching the second active region to form a pair of second active trenches;
forming a plurality of first epitaxial layers in the first and second active trenches;
exposing inner walls of the first active trenches by selectively removing the first epitaxial layers in the first active trenches; and
forming second epitaxial layers in the first active trenches after the removing of the first epitaxial layers in the first active trenches,
wherein forming the plurality of first epitaxial layers comprises:
funning a first silicon germanium layer on inner walls of the first and second active trenches and that includes a first germanium content; and
forming a second silicon germanium layer on the first layer and that fills the first and second active trenches, the second silicon germanium layer including a second germanium content that is greater than the first germanium content,
wherein forming the plurality of first epitaxial layers further comprises:
forming a third silicon layer that covers the second silicon germanium layer and that includes substantially no germanium content.

10. The method according to claim 7, further comprising applying a heat treatment process to form first and second impurity regions by diffusing impurities from the plurality of first epitaxial layers and the plurality of second epitaxial layers into the semiconductor substrate.

11. The method according to claim 10, wherein the first and second impurity regions include abrupt junction profiles and are substantially free of crystal defects.

12. The method according to claim 10, wherein the first impurity region is a source/drain region of an N-channel metal oxide semiconductor transistor region, and
wherein the second impurity region is a source/drain region of a P-channel metal oxide semiconductor transistor region.

13. A method of fabricating a semiconductor device, the method comprising:
forming a device isolation layer in a predetermined region of a semiconductor substrate comprising first and second regions to define first and second active regions in the first and second regions, respectively;
forming first and second gate patterns on the first and second active regions, respectively;
etching the first and second active regions using the gate patterns and the device isolation layer as etching masks to form a pair of first active trenches in the first active region and a pair of second active trenches in the second active region;
forming first epitaxial layers in the first and second active trenches;
exposing inner walls of the first active trenches by selectively removing the first epitaxial layers in the first active trenches; and
forming second epitaxial layers in the first active trenches after the removing of the first epitaxial layers in the first active trenches,
wherein forming the first epitaxial layers comprises:
forming a first layer on inner walls of the active trenches; and forming a second layer on the first layer and filling the active trench on the first layer, wherein a composition ratio of the first layer is different from that of the second layer.

14. The method of claim 13, wherein the first and second regions are N-channel and P-channel metal oxide semiconductor (MOS) transistor regions, respectively.

15. The method of claim 13, wherein the first layer and the second layer are each formed of a semiconductor layer having a lattice constant greater than the semiconductor substrate.

16. The method of claim 13, wherein the second epitaxial layers are formed of a silicon layer doped with N-type impurities or a silicon carbide layer doped with N-type impurities, when the semiconductor substrate is a silicon substrate.

17. The method of claim 13, further comprising forming source/drain regions by diffusing impurities in the first and second epitaxial layers into the semiconductor substrate, after the forming of the second epitaxial layers.

18. The method according to claim 13, wherein the first and second epitaxial layers are doped in situ.

19. The method of claim 1, wherein the first layers are formed to have a first germanium content in a range of about 20 atomic percent to about 30 atomic percent and the second layers are formed to have a second germanium content in a range of about 35 atomic percent to about 50 atomic percent.

* * * * *